United States Patent [19]

Partridge et al.

[11] Patent Number: 5,421,917
[45] Date of Patent: Jun. 6, 1995

[54] TITANIUM-BASED ALLOY PRODUCED BY VAPOR QUENCHING

[75] Inventors: Peter G. Partridge, Bristol; Charles M. Ward-Close, Alton, both of England

[73] Assignee: The Secretary of State for Defence in her Britannic Majesty's Government of the United Kingdom of Great Britain and Northern Ireland, Hants, United Kingdom

[21] Appl. No.: 107,843

[22] PCT Filed: Feb. 24, 1992

[86] PCT No.: PCT/GB92/00326
§ 371 Date: Oct. 12, 1993
§ 102(e) Date: Oct. 12, 1993

[87] PCT Pub. No.: WO92/14852
PCT Pub. Date: Sep. 3, 1992

[30] Foreign Application Priority Data

Feb. 25, 1991 [GB] United Kingdom ................ 9103919

[51] Int. Cl.⁶ .............................................. C22C 21/00
[52] U.S. Cl. .................................. 148/407; 148/403; 148/421; 427/255.2
[58] Field of Search .................. 148/407, 421, 403; 427/255.2

[56] References Cited

U.S. PATENT DOCUMENTS 4,469,536 9/1984 Forester .............................. 148/403

FOREIGN PATENT DOCUMENTS 14472241 of 1976 United Kingdom ......... C22C 21/00

OTHER PUBLICATIONS

Materials Letters vol. 11, No. 8, 9 Jul. 1991 Ward-Close & Partridge p. 295 "The production of titanium-magnesium alloys by vapour quenching".

Primary Examiner—Upendra Roy
Attorney, Agent, or Firm—Nixon & Vanderhye

[57] ABSTRACT

An alloy based on titanium and containing 0.5 to 30% by weight of magnesium, calcium or lithium is produced by vapor quenching to yield a metastable solid solution of solute in titanium. Exemplified alloys containing magnesium have age hardening or solution strengthening characteristics. Vapor quenching enables these alloys to be produced despite the differences in melting temperature between solute and solvent by separate vaporization of each of the species and mixing in the vapor phase. This method provides a route to achieving rapid solidification microstructures unobtainable by other rapid solidification methods. Preferred alloys comprise Ti with 1–15% or 3–7% by weight of magnesium. The alloys may contain other strengthening ingredients currently used in titanium alloys.

15 Claims, 3 Drawing Sheets

TITANIUM-BASED ALLOY PRODUCED BY VAPOR QUENCHING

This invention relates to a metastable solid solution titanium-based alloy produced by vapour quenching. Such alloys are amenable to age hardening by precipitation from the solid solution, but may also find application in the original solid solution form.

BACKGROUND OF THE INVENTION

Vapour quenching is a known process by which alloys having metastable supersaturated solid solutions can be produced. The process comprises evaporation of alloy constituents under vacuum from individual or combined sources to produce a flux of vapours and condensation of the vapours upon a temperature-controlled collector. The collector deposit may be mechanically worked in situ to consolidate the deposit and thus reduce any tendency towards porosity, or may be hot isostatic pressed after removal from the collector. Not all alloys require this subsequent consolidation step. Some are satisfactory in the as-deposited condition, depending on composition, deposition conditions and intended utilisation. A description of this process as applied to aluminium-based alloys is given in two articles by Bickerdike et al. in the International Journal of Rapid Solidification, 1985, vol. 1 pp. 305–325; and 1986, vol. 2, pp. 1–19.

Titanium alloys are well established in the field of aerospace structures and in aero engine applications because they possess a high strength-to-weight ratio at high temperatures. In these known alloys, titanium is commonly alloyed with one or more of the following elements in the indicated proportions by weight:

Al (up to 8%); Sn (up to 11%); Zr (up to 11%); Mo (up to 15%); V (up to 13%); Si (up to 0.5%), and Cr (up to 11%).

Commercial purity titanium may contain the following elements in addition to those strengthening ingredients found in titanium alloys:

$O_2$ (up to 0.32%); $N_2$ (up to 0.006%); C (up to 0.02%); $H_2$ (0.002 to 0.004%), and Fe (up to 0.05%), together with trace quantities of other metals (0.05% or less). Proportions are again indicated by weight. Such elements are normally considered to be impurities but oxygen at least contributes to the hardness of the titanium material and is sometimes considered as a minor but significant alloying ingredient.

The present invention provides new alloys based on titanium incorporating an element from the group consisting of magnesium, calcium and lithium. Little published data is available regarding these three binary systems and it is virtually impossible to incorporate any of these into a titanium alloy made by mixing in the melt because all three elements boil at a temperature below the melting point of titanium. Certain limited data is available for these systems from the evidence of diffusion couples which reveals that all three of these elements have negligible equilibrium solid solubility in titanium (less than 0.5% by weight) and which further indicates that none of them form compounds when present in titanium.

We have discovered that it is possible to make binary alloys of titanium with magnesium, which alloys retain the magnesium constituent in solid solution within the titanium in quantities far greater than the equilibrium solid solubility limit, by producing these alloys using the vapour quenching route. Furthermore, we have found that these magnesium-containing alloys show an appreciable age hardening response which was previously unknown. It is believed that these findings will read across to the closely related elements calcium and lithium which can also be produced as binary alloys with titanium by means of vapour quenching, and that the findings will be valid to a greater or lesser extent when any of these three elements is introduced into a vapour-quenched titanium alloy containing any of the known alloying additions for titanium alloys.

The elements magnesium, calcium and lithium each have densities much lower than that of titanium. Since existing data indicates that none of these elements form compounds when present in binary titanium alloys, this leads to the conclusion that the density of the binary alloy may be predicted reliably by the rule of mixtures. We have found that the rule of mixtures method holds good for vapour-quenched alloys of the titanium-magnesium system at least. Accordingly, those of the alloys claimed hereinafter which incorporate say 2% or more by weight of any of the above elements will exhibit appreciable density reductions which could make them attractive as replacements for present titanium alloys in applications where weight savings are important.

There have been prior reports (for example, in the article by Suryanarayana and Froes, J. Mater. Res. 9 [1990] 1880) of titanium-magnesium alloys produced by another route, namely mechanical alloying. This is a process involving the ball milling under vacuum or an inert atmosphere of separate alloy constituents in powder or similar form to produce small pieces of alloy by agglomeration.

In the reported experiments, the starting material comprised a 9% magnesium/91% titanium mixture in proportions by weight and this was worked in the ball mill for several successive periods between which samples of the agglomerated products were withdrawn and analysed.

The above-mentioned authors concluded from their experiments that they were successful in introducing into solid solution within the mechanically alloyed pieces all the 3% magnesium which analysis revealed to be contained in the material. The evidence advanced to support this conclusion relies on a conventional lattice parameter measurement, but the quoted measurements indicate that the lattice parameters decreased rather than increased with longer periods of ball milling. However, a large increase in lattice parameter was observed when the particulate product was annealed at high temperature.

The atomic radius of magnesium is greater than that of titanium, which means that a solid solution of magnesium in titanium would be expected to lead to an increase in lattice parameter rather than to a decrease. Consequently, the observed decrease in lattice parameter points to some other conclusion than the magnesium being present in solid solution.

By its very nature, the process of mechanical alloying is a long one. With a starting component as reactive with oxygen as magnesium, it will be difficult to avoid oxygen contamination even though the milling is conducted under vacuum or in an inert atmosphere, not least because of the likelihood of oxygen being present in the starting materials. Moreover oxygen is likely to be picked up during the annealing treatment applied to such materials.

The observed lattice parameter increase upon annealing would seem to be more consistent with the conclusion that much of the magnesium in the agglomerated material is present as free magnesium or as an oxide. It does not appear to support the claim that the measured 3% of magnesium in the annealed material is present in solid solution within the titanium.

SUMMARY OF THE INVENTION

The invention claimed herein is a roetastable solid solution titanium-based alloy produced by vapour quenching and comprising at least one of the elements from the group consisting of magnesium, calcium and lithium in a proportion within the range of 0.5 to 30% by weight.

Figure 1:
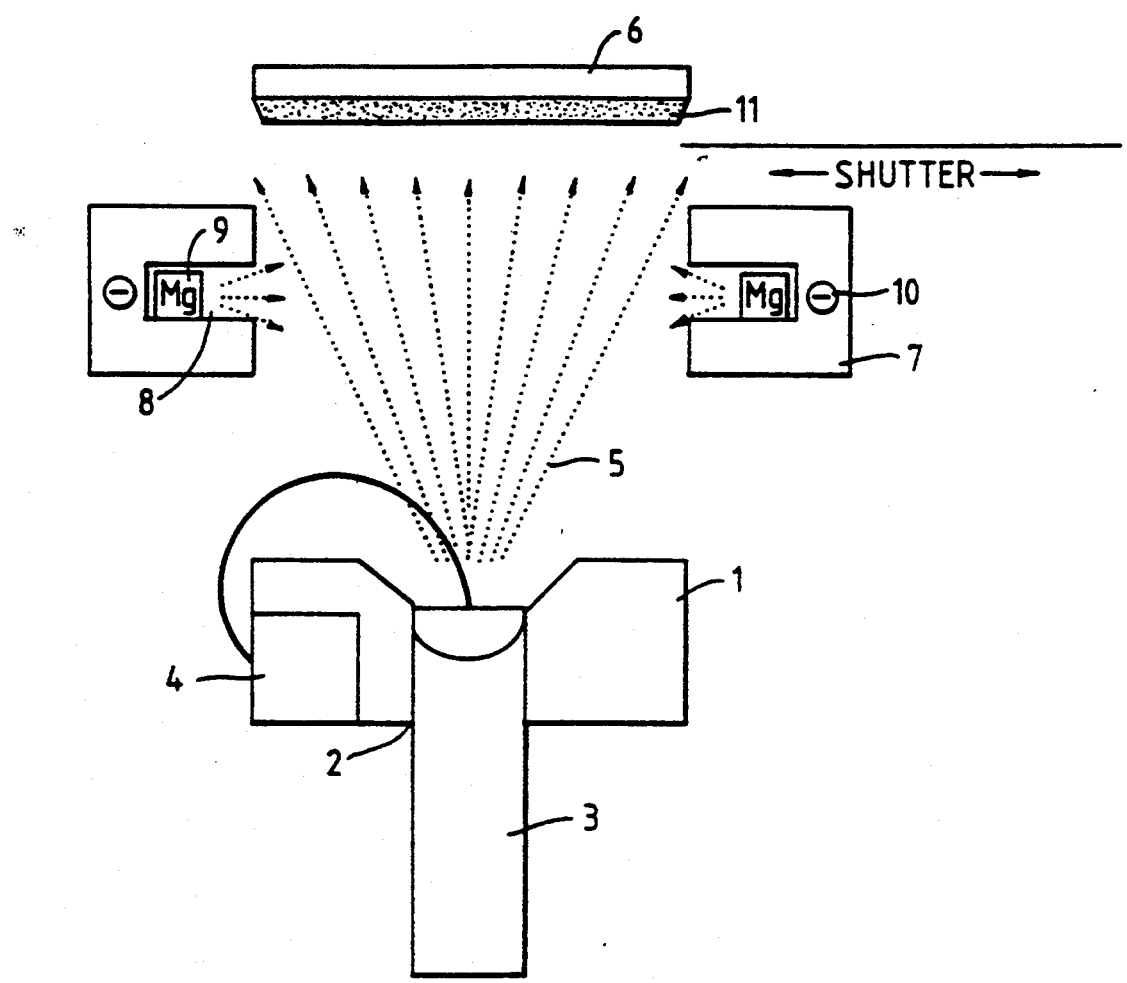
FIG. 1 is a schematic diagram of an apparatus used to produce the claimed alloy.

We have produced binary alloys of titanium and magnesium by vapour quenching with a spread of magnesium contents from 0.65% up to 28% by weight and there is convincing evidence to indicate that the magnesium is retained in solid solution in the alloys as deposited and cooled, X-ray diffactometry traces for as-deposited material have revealed a displacement of the titanium peaks consistent with the magnesium content and an absence of any other diffraction peaks such as those corresponding to pure magnesium. Transmission electron micrographs have not revealed any evidence of secondary phase particles and all of the grains have produced selected. area diffraction patterns corresponding to a hexagonal close. packed lattice as possessed by pure titanium.

We have discovered a significant age hardening in all these titanium-magnesium alloys but there is no simple relationship between microhardness and ageing time for alloys having magnesium contents above 20%. This suggests that for these high magnesium alloys some magnesium is lost during the period of artificial ageing and also that the ageing mechanism may be different for high magnesium alloys. On the other hand, the degree of age hardening experienced with alloys containing less than 1% magnesium was small. We therefore believe that a range limit of 1 to 15% by weight of magnesium will mark the boundaries of useful age hardening properties in the magnesium containing alloys.

The above-mentioned titanium-magnesium alloys were produced using commercial purity titanium as the titanium source and the oxygen content of this was 0.16% by weight. Analysis of a vapour quenched sample of unalloyed titanium revealed that it contained 0.26% by weight of oxygen in the as-deposited condition. It is likely that the titanium-magnesium alloys which have revealed the age hardening response contained something of the order of 0.26% by weight of oxygen and it is postulated that the age hardening response involves some precipitation of oxides of magnesium.

A magnesium content of between 3 and 7% by weight seems to give the best age hardening response as is revealed in the figures given hereinafter and this range is presently preferred.

It is likely that higher alloys can be produced that achieve the same solid solution characteristics by vapour quenching titanium-based alloys which contain additional constituents from amongst the range of elements found in prior art titanium alloys, in addition to the elements magnesium, calcium or lithium. Accordingly, we claim vapour-quenched titanium-based alloys comprising at least one of the elements from the group consisting of magnesium, calcium and lithium in a proportion within the range 0.5 to 30% by weight and further including one or more strengthening elements from the group consisting of aluminium, tin, zirconium, molybdenum, vanadium, silicon and chromium in individual proportions not exceeding 15% by weight and in total proportion not exceeding 30% by weight when present in combination, with up to 0.32% by weight of oxygen. Preferably, the proportions of the strengthening elements are within the proportions stated above for known titanium alloys.

The invention will now be described by way of example with reference to the drawings.

Titanium-based alloys with varying contents of magnesium can be produced by use of the apparatus depicted schematically in FIG. 1. The apparatus has separate sources for the titanium and magnesium charges. The former comprises a water-cooled copper crucible 1 with an underside opening 2 through which is fed a rod charge 3 of titanium. An electron beam gun 4 is directed steered so that the electrons impinge upon the topmost end of the rod charge 3 to cause this to be melted locally. A stream of titanium vapour 5 issues from the melt pool in an upward direction towards a collector 6 and the flux of vapours is controlled by adjustment to the power setting of the electron beam gun 4.

The vapour source For the magnesium constituent of the alloy is a heated block 7 of metal of a generally "U"-shaped configuration which is located above the level of the titanium source crucible 1 and is of a size and disposition such that it encompasses the rising flux of titanium vapour on three sides thereof. Block 7 has an inwardly directed slot 8 within which solid charge pieces 9 of magnesium are placed and is heated by means of a radiant heater 10 extending through the mass of the block. In use, the block is heated to a temperature at which magnesium vapours evolve from the charge pieces 9 by sublimation. These vapours issue laterally through the slot opening and impinge upon the rising flux 5 of titanium vapour. Vapour mixing takes place by mingling of the vapour streams and scattering caused by atomic collisions. Some of the intermixed vapours rise upwards to condense upon the collector 6 to yield a deposit 11.

The collector is heated to and maintained at a suitable temperature to ensure that the impinging vapours are quenched to produce an appropriate microstructure in the alloy deposit 11. Between the collector plate 6 and the sources of vapours there is a shutter which is closed during the warm-up period of operation of the equipment and which is opened when the equipment reaches equilibrium. This measure is adopted to avoid collection of deposits having an undesired composition.

Example 1

During use of the above-described apparatus for the production of titanium-magnesium alloys as exemplified below, the apparatus was controlled to the following parameters:
collector temperature 200° C.
electron beam gun power 2-3 kW
magnesium source temperature up to 650° C.
vacuum chamber pressure $5 \times 10^{-5}$ torr Variation of composition was achieved by alteration or the respective rates of generation of the titanium and magnesium vapours. The electron beam gun power was varied within the range given above to increase or decrease the flux of titanium vapours and the temperature to which the magnesium source was heated was varied (between values below the melting temperature) to increase or decrease the flux of magnesium vapour. Simultaneous manipulation of both these allowed the alloy deposition rate to be controlled.

The alloy deposits produced were approximately 100 mm in diameter and up to 8 mm thick. They were approximately 98% dense. The composition of these alloys was determined by electron probe micro-analysis and confirmed by wet chemical analysis. Lattice parameters were determined by X-ray diffraction. The lattice parameters for some of the claimed alloys, together with comparative figures for commercial purity titanium, are given below:

| Alloy | % Mg | Lattice parameters (m × $10^{-9}$) | | |
|---|---|---|---|---|
| | | A axis | C axis | C/A |
| Ti* | 0 | 0.2955 | 0.4686 | 1.585 |
| Ti** | 0 | 0.2951 | 0.4700 | 1.593 |
| Ti - 7% Mg | 7 | 0.2965 | 0.4754 | 1.603 |
| Ti - 28% Mg | 28 | 0.2996 | 0.4827 | 1.611 |

Ti* denotes commercially pure titanium in the as-deposited condition.
Ti** denotes the same material after annealing for 30 minutes at 600° C. in a vacuum furnace.
These are included in the table for the purposes of comparison only.

The lattice parameters of the alloy materials above increase significantly and consistently with increasing magnesium content. These measurements, coupled with the absence of indications from X-ray micro analysis of either free titanium or of large quantities of oxygen, give firm indications that the magnesium is present in solid solution in the titanium alloy as deposited.

Microhardness measurements were made upon polished sections taken through the thickness of the deposit. Example alloys were produced with measured magnesium contents ranging from 0.65 to 28.0% by weight. Each of these was then subjected to a variety of age-hardening treatments. The results of these are tabulated below and depicted graphically in FIGS. 2 and 3. Each age-hardening treatment comprised exposure to an elevated temperature (at the stated level) for a period of 30 minutes within a vacuum furnace.

| Mg CONTENT (wt %) | AGEING TEMPERATURE (°C.) | | | | | |
|---|---|---|---|---|---|---|
| | 200 | 300 | 400 | 500 | 600 | 700 |
| | MICROHARDNESS-VICKERS PYRAMID NUMBER | | | | | |
| 0.06 | 231 | 278 | 417 | 509 | 481 | 437 |
| 1.4 | 226 | 193 | 172 | 431 | 413 | 361 |
| 3.6 | 298 | 360 | 464 | 546 | 585 | 578 |
| 4.0 | 277 | 364 | 468 | 546 | 585 | 578 |
| 7.0 | 250 | 275 | 298 | 330 | 257 | — |
| 12.9 | 255 | 335 | 318 | 344 | 411 | 446 |
| 21.0 | 235 | 219 | 230 | 203 | 209 | 360 |
| 28.0 | 179 | 203 | 142 | 246 | 320 | 387 |

Figure 2:
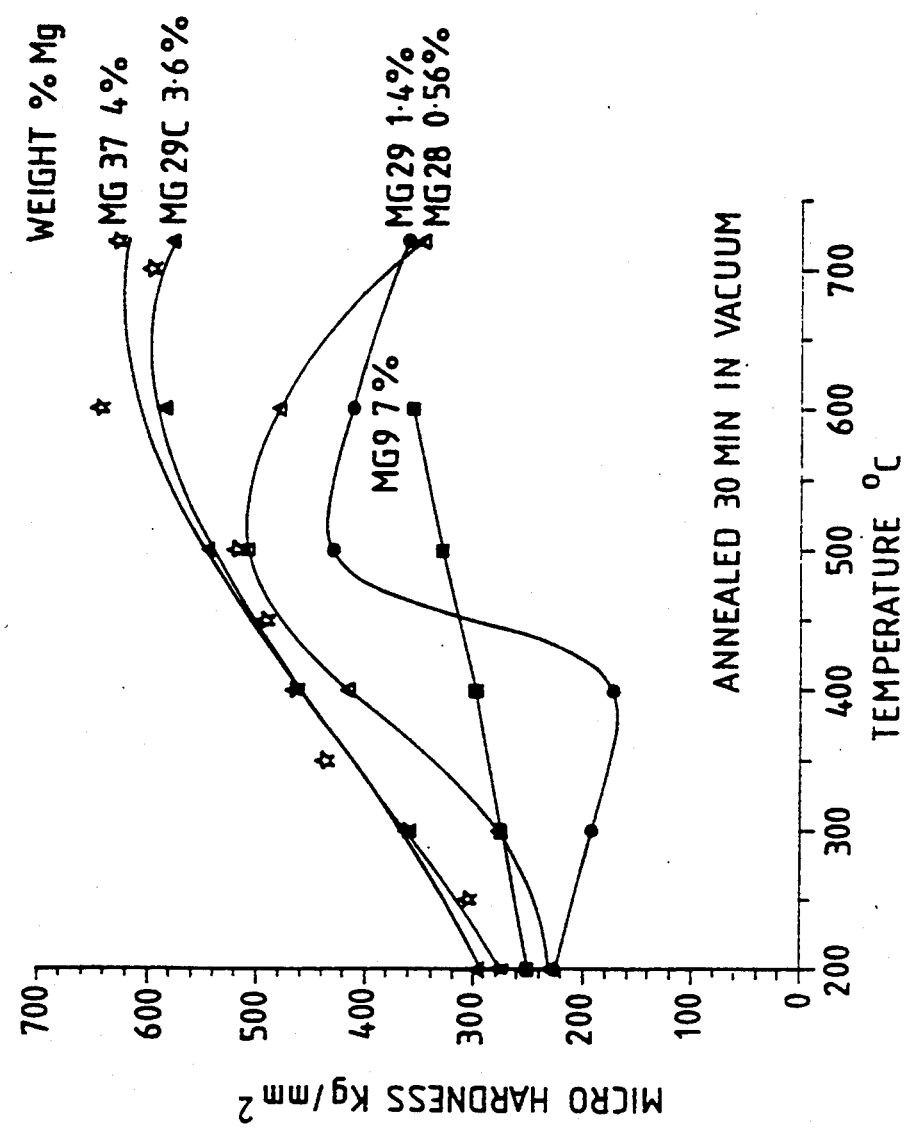
FIG. 2 is a graph of the age hardening response of various titanium-magnesium alloys made by vapor quenching.
Figure 3:
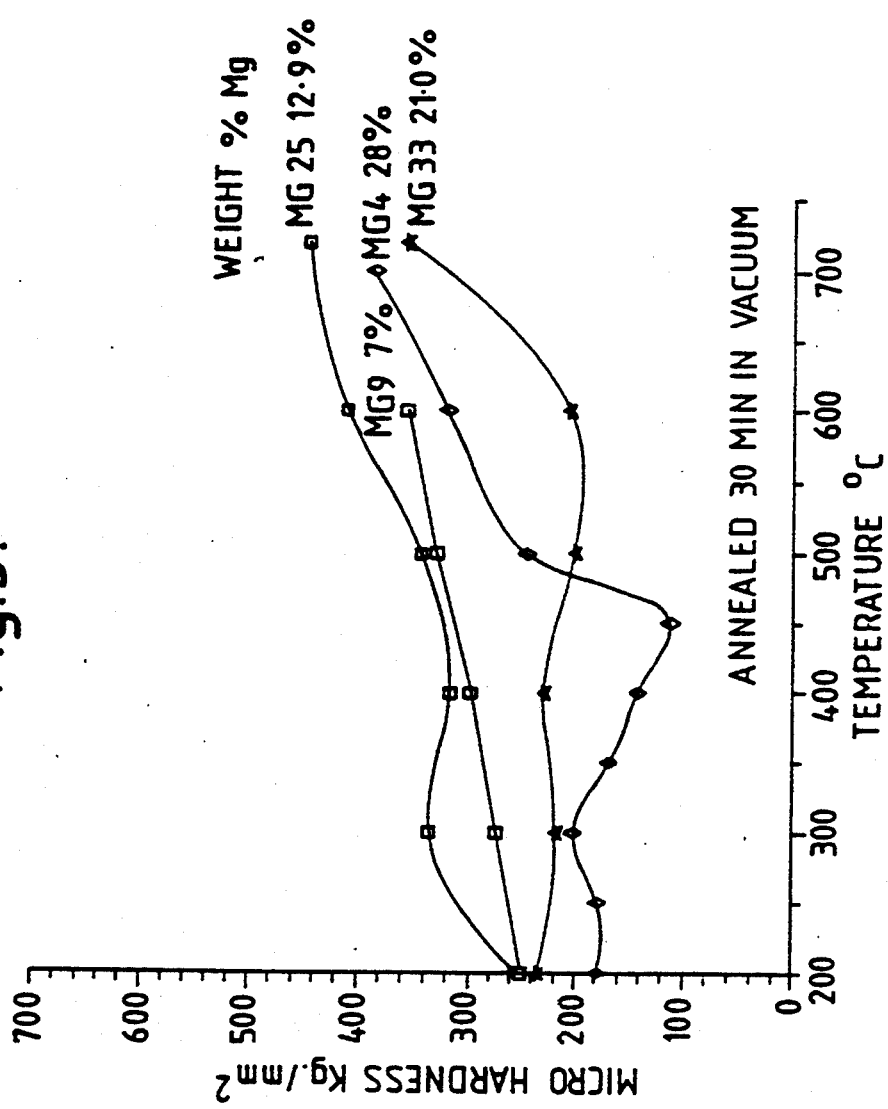
FIG. 3 is a graph of the age hardening response of further titanium-magnesium alloys made by vapor quenching.

It will be seen from the above tabulation of data, and more clearly from the plots comprising FIGS. 2 and 3, that there is some degree of age hardening response in all examples, though this is neither pronounced nor consistent for those alloys having magnesium contents near either end of the range examined. From an age hardening perspective the alloys having magnesium contents of 3 to 7% are best with the 3.6 and 4.0% magnesium alloys appearing to be the best of all these. In the above tabulation, the materials recorded as being aged at 200° C. are in fact the materials as deposited—200° C. being the temperature of the collector. Commercially pure titanium when evaporated and vapour quenched yields a comparison value of microhardness of 246 so it can be seen that those alloys in the range of magnesium contents from 3 to 13% show a useful increase in hardness in the unaged condition relative to this value.

X-ray diffractometry measurements of the as-deposited material at all levels of magnesium content covered above, were consistent with expectations for materials with full absorption of the magnesium into solid solution. Moreover there was no evidence to point to any other interpretation for there was no indication of free magnesium (indicating incomplete absorption), nor of significantly increased oxygen content (which might confuse the interpretation of lattice parameter and microhardness measurements).

Example 2

In the preparation of titanium-calcium alloys, the apparatus was controlled to the following parameters:
collector temperature 400° C.
electron beam gun power 3 kW
calcium source temperature up to 600° C.
vacuum chamber pressure $5 \times 10^{-5}$ torr Sample titanium-calcium alloys were prepared having calcium contents between 1.6 and 1.9% by weight. Microhardness measurements were made as before, i.e. on polished sections taken through the thickness of the deposit, for a sample alloy containing 1.8% by weight of calcium:

| Ca CONTENT (wt %) | AGEING TEMPERATURE (°C.) | | | |
|---|---|---|---|---|
| | 400 | 500 | 600 | 700 |
| | MICROHARDNESS-VICKERS PYRAMID NUMBER | | | |
| 1.8 | 160 | 213 | 260 | 228 |

The table above shows an age hardening response in titanium-calcium alloys similar to that shown by titanium-magnesium systems. As previously seen in the alloys with low magnesium content, (eg up to 4% by weight) the high temperature ageing treatment at 700° C. tends to use a slight diminution in hardness compared to the value obtained at 600° C. Nevertheless, a significant improvement in hardness can be obtained over the unaged alloy by selection of the correct ageing criteria.

The apparatus described herein is only suitable for the production of alloys on a small scale. Furthermore, it is not ideally suited to the production of alloys other than materials of the titanium-magnesium type in which the alloying constituents have widely differing vapour pressures. In scaling up this apparatus for use in the production of more extensive deposits of alloy and also in producing ternary or higher alloys, a different arrangement may be required for the evaporation of the second or further constituents. For example, a double evaporation bath equipment such as that described in our earlier UK patent application 9022449.4 (publication number GB-A-2 248 852) or something having similar capabilities for dealing with constituents having disparate vapour pressures would be required.

We claim:

1. A method of producing a metastable solid solution titanium-based alloy comprising at least one of the elements selected from the group consisting of magnesium, calcium and lithium in a total proportion within the range of 0.5% and 30% by weight, said method comprising the steps of:
   (i) placing each alloy constituent in a vapor quenching apparatus;
   (ii) heating said constituents to a temperature sufficient to vaporize each of said constituents to form a vapor;
   (iii) heating a collector to, and maintaining said collector at, a temperature suitable for ensuring deposition of said alloy in an appropriate microstructure;
   (iv) controlling of said vapors to ensure deposition of appropriate ratio of said constituents; and
   (v) commencing deposition of said alloy following achievement of operation equilibrium of said apparatus.

2. The method according to claim 1 wherein said alloy comprises magnesium in the range of 0.65% to 28% by weight.

3. The method according to claim 1 wherein said alloy comprises magnesium in the range of 1% to 15% by weight and comprising the additional step of (vi) age hardening said alloy.

4. The method according to claim 1 wherein said alloy comprises additional elements, where said included additional elements are oxygen in a range of trace existence to 0.32% by weight, and at least one strengthening element selected from the group consisting of aluminum, tin, zirconium, molybdenum, vanadium, silicon and chromium, each element being present in ranges of trace existence to 15% by weight, and a total constituent proportion of said strengthening elements having a range of trace existence to 30% by weight.

5. The method according to claim 1 further comprising the step of (vi) age hardening the said alloy at a temperature in the range of 300° C. to 700° C.

6. A metastable solid solution titanium based alloy produced by the method of claim 1.

7. A metastable solid solution titanium based alloy produced by the method of claim 2.

8. The method according to claim 3 wherein said alloy comprises magnesium in the range of 3% to 7% by weight.

9. A metastable solid solution titanium based alloy produced by the method of claim 3.

10. The method according to claim 4 wherein the alloy comprises said elements in individual ranges by weight of:

| | |
|---|---|
| aluminum | trace existance to 8% |
| tin | trace existance to 11% |
| zirconium | trace existance to 11% |
| molybdenum | trace existance to 15% |
| vanadium | trace existance to 13% |
| silicon | trace existance to 0.5% |
| chromium | trace existance to 11% |
| oxygen | trace existance to 0.32%. |

11. A metastable solid solution titanium based alloy produced by the method of claim 4.

12. A metastable solid solution titanium based alloy comprising at least one of the elements from a group consisting of magnesium, calcium and lithium in a proportion within the range of 0.5% to 30% by weight produced by the method of claim 5.

13. A metastable solid solution titanium based alloy produced by the method of claim 8.

14. A metastable solid solution titanium based alloy produced by the method of claim 10.

15. A metastable solid solution titanium based alloy comprising at least one of the elements from a group consisting of magnesium, calcium and lithium in a proportion within the range of 0.5% to 30% by weight.

* * * * *